United States Patent [19]

Hanazono et al.

[11] 4,024,041
[45] May 17, 1977

[54] METHOD OF FORMING DEPOSITION FILMS FOR USE IN MULTI-LAYER METALLIZATION

[75] Inventors: Masanobu Hanazono; Osamu Asai; Katsumi Tamura, all of Hitachi, Japan

[73] Assignee: Hitachi, Ltd., Japan

[22] Filed: Dec. 16, 1975

[21] Appl. No.: 641,299

[30] Foreign Application Priority Data

Dec. 18, 1974 Japan .......................... 49-144500
Dec. 18, 1974 Japan .......................... 49-144501

[52] U.S. Cl. .......................... 204/192 C; 118/505; 204/192 EC; 204/192 E; 204/192 N; 427/39; 360/110

[51] Int. Cl.² .......................... C23C 15/00

[58] Field of Search .......... 204/192, 298; 427/39; 118/504, 505

[56] References Cited

UNITED STATES PATENTS

| | | | |
|---|---|---|---|
| 3,170,810 | 2/1965 | Kagan | 204/192 X |
| 3,661,747 | 5/1972 | Byrnes, Jr. et al. | 204/192 |
| 3,723,277 | 3/1973 | Schmiedecke | 204/192 |
| 3,791,952 | 2/1974 | Labuda et al. | 204/192 |
| 3,897,324 | 7/1975 | Del Monte et al. | 204/298 |

FOREIGN PATENTS OR APPLICATIONS 738,393   7/1966   Canada .............................. 204/298

OTHER PUBLICATIONS

F. W. Ingle "A Shadow Mask For Sputtered Films", Rev. Sci. Instruments, vol. 45, No. 11, Nov. 1974, pp. 1460-1461.

Primary Examiner—John H. Mack
Assistant Examiner—Aaron Weisstuch
Attorney, Agent, or Firm—Craig & Antonelli

[57] ABSTRACT

A method of forming thin films wherein a film is formed through glow discharge such as ion plating or sputtering by using a mask whose surface in contact with the surface of the substrate on which the film is formed is provided with a thermostable elastic member, whereby the film, for use in multi-layer metallization, can be formed with high dimensional precision and intimacy.

9 Claims, 9 Drawing Figures

METHOD OF FORMING DEPOSITION FILMS FOR USE IN MULTI-LAYER METALLIZATION

BACKGROUND OF THE INVENTION

1. Field of the Invention

This invention relates to a method which employs an improved mask for forming micro-multi-layer metallization films of high intimacy and dimensional precision through ion plating or sputtering.

2. Description of the Prior Art

When circuits and circuit elements are formed by means of thin film integrated circuit fabrication techniques, it is a general practice, to form electrically conductive members and insulator films by vacuum deposition, sputtering, ion plating or like methods. Although films formed by vacuum deposition have greatly inferior intimacy with the substrate compared to those formed by sputtering or ion plating, vacuum deposition is widely used because of its ease of forming film with extremely precise patterns by the aid of masks. On the other hand, films formed by sputtering or ion plating have superior intimacy with the substrate and excellent characteristics required for stacking up on step covering portions inherent in multilayer metallization. With a deposition mask commonly used for vacuum deposition, however, sputtering or ion plating cannot be used to form a fine pattern with desired dimensional precision. In vacuum deposition in which evaporated particles more freely in an evacuated atmosphere having a pressure on the order of $10^{-4}$ Torr or less, the particles will have so long a mean free path as to be free from scattering, and will reach the surface to be deposited after passing through a masked pattern in a substantially straight path from the particle source. Consequently, the masked pattern is accurately transferred to the surface to be deposited. On the other hand, in sputtering or ion plating in which the multi-layer stacking of films is performed under a pressure of $10^{-2}$ to $10^{-3}$ Torr, atoms will have so short a mean free path as to tend to scatter, thereby depositing particles which scatter into the slight gap between the surface to be deposited and the mask. Therefore, no industrial processes for masked deposition by means of sputtering or ion plating have yet been established. In order that a precise deposited pattern be formed by sputtering or ion plating, a lift-off process may be employed in which sputter deposition is effected onto a surface to be coated that has a mask pattern previously formed by vacuum deposition and the mask pattern is subsequently removed by etching; alternatively, a mask pattern of photo-resist is formed on surface which has been subjected to deposition by sputtering or ion plating and the desired pattern is formed by etching. These measures involve chemical etching processes so that chemical etching solvents and etching mask materials inevitably contributes to contamination and deterioration of the stacking material.

SUMMARY OF THE INVENTION

An object of the invention is to provide an improved method of forming a multi-layer metallization device.

Another object of the invention is to provide a method of forming a multi-layer metallization device wherein a film of precise patterns can be deposited rapidly by sputtering or ion plating.

Still another object of the invention is to provide a method of forming a highly insulative and protective film of $SiO_2$ or $Ta_2O_5$ which is applicable to the production of a low noise thin film magnetic head.

According to the invention, there is provided a method of depositing thin films wherein particles having a short mean free path due to a relatively low vacuum are bombarded and partially stacked on a substrate to be coated with thin films through a mask whose surface in contact with the surface of the substrate is provided with an elastic member. The elastic member prevents the particles from scattering beneath the mask, thereby assuring the formation of a thin film precisely transferred from the mask pattern.

DESCRIPTION OF PREFERRED EMBODIMENTS

Figure 1A:
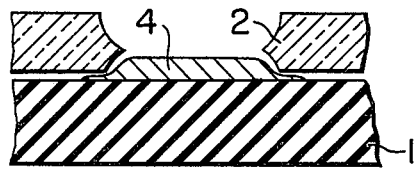
FIGS. 1a and 1b are partial section views showing the formation of stacking material in relation to a mask.

Those particles having a short mean free path that are intended to be coated on a substrate through a mask are generated in an atmosphere of relatively low vacuum. Specifically, in accordance with the sputtering process, gaseous molecules are ionized in a glow discharge region and the ionized gaseous molecules bombard a source containing materials to be coated so that particles to be coated are emitted from the source toward a substrate and deposited thereon. In accordance with the ion plating process, a source of particles is heated to evaporate particles which in turn are ionized in a glow discharge region, and the ionized particles are directed towards a substrate so as to be coated thereon. If the prevailing atmosphere contains oxygen and nitrogen, oxides and nitrides of the particles can be coated on the substrate. These processes which utilize a glow discharge are performed under a relatively low vacuum of $10^{-1}$ to $10^{-3}$ Torr.

Any materials that can be coated by conventional sputtering or ion plating processes can also be coated by the method of the invention. For example, inorganic insulators and high melting point metals may be used for sputtering; metals suitable for common evaporation and low melting point inorganic compounds may be used for ion plating. The invention can be realized with conventional sputtering equipment which is operated at 0.8 KV to 4 KV cathode voltage and a vacuum of less than $10^{-3}$ Torr, which is the most suitable for glow discharge of inert gas or oxygen gas. A typical ion plating device, also usable in the invention, comprises a substrate which is connected to a cathode electrode. A negative potential more than 1 KV is applied to the cathode so that a glow discharge region is established between the cathode and anode. The chamber is evacuated to a pressure of $10^{-3}$ Torr at the most.

A precisely patterned mask is mounted on the surface of the substrate. Preferably, the mask is made of glass or metal, but may be made of any material, for example thermostable plastic plate, provided that the mask can shield the incident particles and will not deform or burn out when heated by sputtering.

The mask is provided with an elastic member facing the substrate and lying between the mask and substrate. Preferably, the elastic member is made of a bundle of fibers such as glass wool, quartz fibers, metal fibers, whiskers of metal or of a metallic compound, each fiber being of less than 10 μm diameter. Any other fibers, for example aromatic polyamide fibers, may be used provided that they are thermostable at temperatures of 300° C or less. For example, semicured films of polyimide-isoindoloquinazollimedione and tetra alkoxy silane may also be used.

The elastic member is fixed to the mask. If the elastic member has long fibers, the fibers are twisted and then pressed into a flat plate configuration. The resultant structure is fixed to the substrate at more than two locations and then cut away along the mask pattern by means a laser beam. In this manner, thermostable fibers can be fixed to the mask in the same configuration as the mask. Preferably, the thickness of the pressed layer is more than twice the depth of any irregularities on the mask. Alternatively, thermostable fibers are placed on the mask material. Portions of the fibers swelling out from the mask are cut away by means of a laser beam and the height of the fibers is evened to the order of 10 μm to 1 mm by means of laser cutting. Present-day laser working techniques permit precise working at a precision of the order of 0.1 μm. If the elastic member is made from material soluble in a solvent, it is preferable to coat dissolved material onto the mask.

Since present-day techniques permit arranging the fibers densely, two or three rows of fibers are satisfactory to shield sputtered particles which may be scattered into any gaps between the mask and the substrate. Assuming that fibers are spaced apart at a distance of 0.5 – 1.0 μm, two to three rows of fibers suffice to shield the sputtered particles. Thus, penetration of the sputtered particles is limited to not more than 4 to 6 μm from the edge of the mask pattern.

A substrate for multi-layer metallization to which the invention is applied has complex irregularities on its surface. The height of irregular configuration sometimes rises to 50 μm, but is usually from 1 μm to 10 μm. The elastic member applied to one surface of the mask is required to follow completely the irregularities and to eliminate any gaps between the mask and the multi-layer metallization substrate. Therefore, the deformable thickness of the elastic member is preferably 1.2 to several times as large as the height of the irregular configurations of the substrate.

Figure 1B:
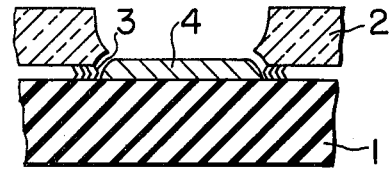

Such a mask is mounted on the substrate at a predetermined location and fixed thereto mechanically. Sputtering follows in the conventional manner. Principal causes for error in a mask pattern are (1) displacement of mask location, (2) adverse sectional configuration of the mask, (3) scattering of particles beneath the mask, and (4) differences in thermal expansion coefficient between the mask and the substrate. The error due to the displacement of mask location and the difference in thermal expansion coefficient cannot be eliminated by the provision of an elastic member on the mask. However, the error due to the adverse section configuration of the mask and the scattering of particles varies, dependent on the presence or absence of the elastic member. As shown in FIGS. 1a and 1b, a window of a mask 2 which is opened by chemical etching or electrolytic polishing cannot have an upright inner wall. In the case of vacuum deposition, the evaporated particles will not scatter along a straight line connecting the vapor source and the mask so that there occurs no deep scattering of the particles into any gaps between the mask and the substrate. By contrast, in the case of sputtering, the particles penetrate at the edge of the window formed by the mask and deposit on the substrate, as shown in FIG. 1a. The width of this penetration often amounts to a distance several times as large as the thickness of the deposited layer. Since the elastic member 3 is applied with a vertical compressive force, extending laterally, the lateral extension of scattering particles is reduced by the deformation of the elastic member as shown in FIG. 1b. Practically, it is almost impossible to assure completely intimate contact of the rigid mask with the rigid substrate, and the lateral extension of scattering particles amounts to 10 μm to 50 μm in the absence of the elastic member. As shown in FIG. 1b, the elastic member 3 substantially completely prevents the particles from scattering beneath the mask.

The sputtering or ion plating equipment includes a direct current or high frequency power source for generating a glow discharge. When the polarity of the power source is changed such that the substrate serves as a target and a glow discharge is produced between the target and a shutter, the substrate is cleaned by sputtering. This operation removes contaminants such as photoresist residues and any thin oxide films so that adhesive strength between the deposited film and the substrate is greatly improved as compared with vacuum deposition and especially, resistance between conductive layers is greatly reduced.

Embodiment 1

Figure 2A:
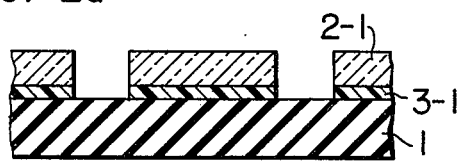
FIG. 2a to 2f are partial section views showing the formation steps of a multi-layer metallization device in accordance with one embodiment of the invention.
Figure 2B:
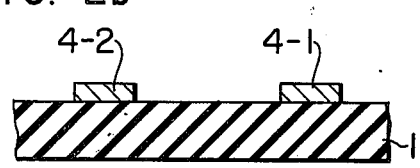
Figure 2C:
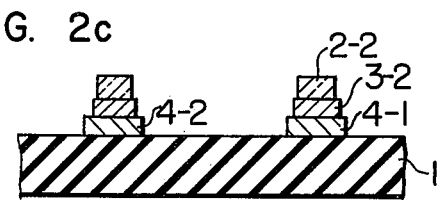
Figure 2D:
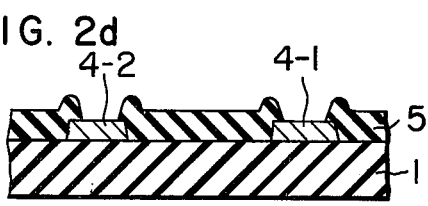

Firstly, as shown in FIG. 2a, a glass mask 2-1 with an elastic film 3-1 is mounted on an alumina insulator substrate 1 with a polished surface, the elastic film being made of a polyimide-isoindoloquinazolimedione coating on one surface of the mask, which is solidified for one hour at 100° C. Two grooves, each having 20 μm width, are formed in the mask in 100 μm spaced relationship. The structure thus prepared is subjected to aluminum sputtering to form aluminum conductors 4-1 and 4-2, and the mask 2-1 and the elastic film 3-1 removed, as shown in FIG. 2b. In the process of FIG. 2c, a mask 2-2 is mounted on the conductors 4-1 and 4-2. Elastic member 3-2 used in this phase comprises a glass fiber weave which will not injure the soft conductors. An insulator film 5 of silicon dioxide is deposited on the structure of FIG. 2c by sputtering, as shown in FIG. 2d after removal of layers 2—2 and 3-2, such that edge portions of the conductors 4-1 and 4-2 are covered with the insulator film 5. Again, a mask 2–3 is used in the process of FIG. 2e. The mask 2-3 is made of a metallic molybdenum plate and provided with metallic fibers 3-3. The structure of FIG. 2e after being cleaned by sputtering of the surfaces of conductors 4-1 and 4-2, is coated with aluminum to form an aluminum conductor layer 6. FIG. 2f shows a section view of a completed multi-layer device after the removal of layers 2-3 and 3-3. The width of the conductors 4-1 and 4-2 at the step of FIG. 2b and the electrical resistance between the conductors 4-1 and 4-2 at the final step of FIG. 2f were measured. The width and resistance of multi-layer metallization devices prepared by masked vacuum deposition and by masked sputtering without the elastic member were measured. Experiments were conducted on ten devices of the same configuration prepared by each of three methods, totalling thirty devices. Measurement results are listed in Table 1.

Table 1

| | Width of conductor ($\mu$m) | Resistance ($\Omega$) |
|---|---|---|
| Embodiment 1 | 21 ~ 22 | 0.005 ~ 0.01 |
| Masked sputtering without elastic member | 28 ~ 45 | 0.02 ~ 0.3 |
| Masked vacuum deposition | 22 ~ 27 | 0.1 ~ 0.7 |

Figure 2E:
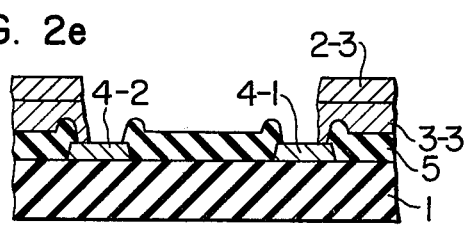
Figure 2F:
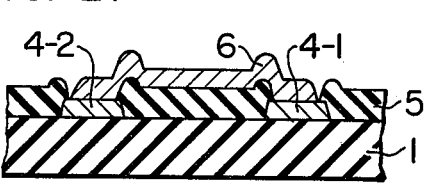

It is considered that the high resistance in the masked vacuum deposition case results from the lack of sputtering in the step corresponding to FIG. 2e, thus oxide films are left between conductor layers.

Embodiment 2

Figure 3:
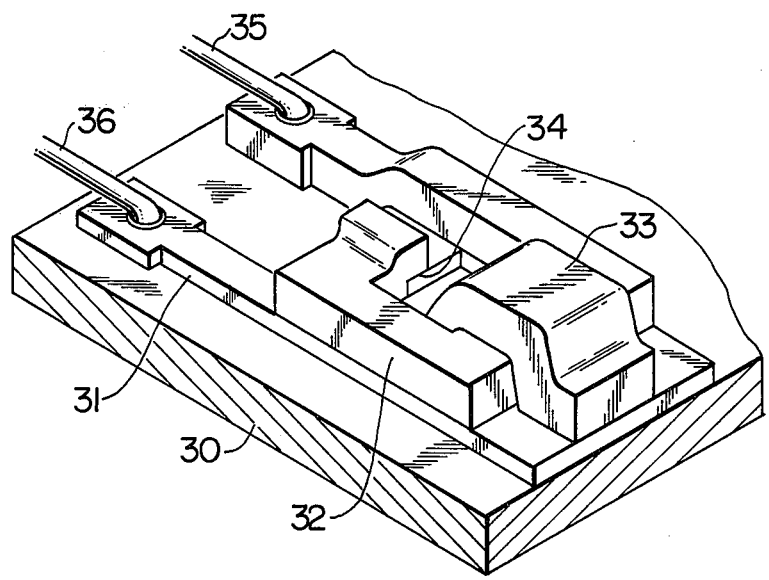
FIG. 3 is a perspective view of a two-turn coil magnetic head device in accordance with another embodiment of the invention.

A thin film magnetic head device having a two-turn coil as shown in FIG. 3 was produced in accordance with the invention. On a magnetic base of ferrite forming substrate 30, a first conductor layer 31 of aluminum is deposited by masked sputtering. The overall surface of a structure thus prepared is sputter coated with aluminum oxide while masking future junction 34 between the first conductor layer and a second conductor layer, a portion of which the magnetic base magnetically couples with an upper magnetic member 33, and a portion of which forms a bonding pad for a lead wire 36. The second conductor layer 32 is then formed by masked sputtering, and the upper magnetic member 33 formed masked sputtering of permalloy (nickel 80% - iron 20%). Chromium, copper and gold are deposited by masked sputtering on bonding pad portions for lead wires 35 and 36, and copper lead wires are soldered to the bonding pad portions. Finally, the overall surface of the structure thus prepared is covered with a silicon dioxide protective film. A mask is produced by depositing glass wool filaments having about 1 $\mu$m diameter and 1 mm length on a stainless plate 0.5 mm thick by means of electrostatic deposition, and by cutting away portions of the bundle swelling out from the mask edge and making the height of the bundles uniform by means of a laserr beam of 0.2 $\mu$m diameter.

A conventional process of producing a magnetic head device of the same configuration comprises depositing a first conductor layer through a mask, anodizing the surface of the first conductor layer, removing the anodized film at the portion to which a second conductor is connected, mask depositing the second conductor layer, depositing a dioxide silicon film on the overall surface of the resultant structure, partially removing the silicon dioxide film at a magnetic coupling portion for an upper magnetic member and at lead wire bonding pad portions by means of chemical etching, mask depositing the upper magnetic member of permalloy, and bonding lead wires to the pads.

Resistance between the lead wires was measured. For the magnetic head device of the invention, the measured value was 1$\Omega$ to 1.2$\Omega$ which approximated a theoretical value; for the conventional one, a 2$\Omega$ to 3$\Omega$ measured value resulted. Further, a cyclic thermal test between −20° C and 150° C proved that the magnetic head device of the invention is durable against thermal cycles of more than five times the thermal cycles for the conventional magnetic head device. Probably, long life time results from the fact that films formed by the sputtering process has higher adhesive strength with the substrate than films formed by vacuum deposition, and the elimination of chemical etching by immersing the structure into chemical liquid etchants and anodization steps prevents the creation of contaminants.

We claim:

1. A method of forming thin films for use in multilayer metallization wherein a film having a desired pattern is formed on a substrate by glow discharge in a gas pressure of $10^{-1}$ Torr to $10^{-3}$ Torr, comprising depositing a thin film on the substrate while maintaining a mask having a window forming the desired pattern in intimate contact with the substrate, said mask comprising an elastic layer on at least an edge of its surface which comes into contact with said substrate.

2. A method according to claim 1, wherein the deformable thickness of said elastic layer is at least 1.2 times as large as the height of irregular configurations on the surface of said substrate.

3. A method according to claim 1, wherein said elastic layer is thermostable at temperatures less than 300° C.

4. A method according to claim 1, wherein said elastic layer comprises thermostable fibers in at least two rows along the inner wall of the window.

5. A method according to claim 1, wherein said elastic layer comprises a thermostable resin film.

6. A method of forming thin films for use in multilayer metallization wherein a compound film of a desired pattern is formed on a substrate by glow discharge deposition in a gas pressure of $10^{-1}$ to $10^{-3}$ Torr, comprising depositing a thin film on the substrate in a gas atmosphere containing at least one component of said compound while maintaining a mask having a window forming a desired pattern in intimate contact with the substrate, said mask comprising an elastic layer on at least an edge of its surface which comes into contact with said substrate.

7. A method according to claim 6, wherein the deformable thickness of said elastic layer is at least twice as large as the height of the irregular configurations on the surface of said substrate.

8. A method according to claim 6, wherein said elastic layer is thermostable at temperatures less than 300° C.

9. A method of forming a thin film for use in multilayer metallization wherein a film of a desired pattern is formed on a substrate by glow discharge in a gas pressure of $10^{-1}$ Torr to $10^{-3}$ Torr, comprising the steps of cleaning the substrate by sputtering while maintaining a mask having a window forming a desired pattern in intimate contact with the substrate, said mask being provided with an elastic layer on at least an edge of its surface which comes into contact with said substrate, and depositing a thin film on the substrate immediately after said cleaning is completed.

* * * * *